United States Patent [19]
Cava et al.

[11] Patent Number: 5,470,530
[45] Date of Patent: Nov. 28, 1995

[54] ARTICLE COMPRISING AN INTERMETALLIC SUPERCONDUCTOR MATERIAL

[75] Inventors: Robert J. Cava, Bridgewater; Theo Siegrist, Neshanic Station, both of N.J.

[73] Assignee: AT&T IPM Corp., Coral Gables, Fla.

[21] Appl. No.: 177,837

[22] Filed: Jan. 5, 1994

Related U.S. Application Data

[63] Continuation-in-part of Ser. No. 165,143, Dec. 10, 1993, which is a continuation-in-part of Ser. No. 143,419, Oct. 26, 1993, Pat. No. 5,413,755.

[51] Int. Cl.$^6$ ............... C22C 5/04; C22C 19/03; C22C 28/00; C22C 30/00
[52] U.S. Cl. ............... 420/416; 420/455; 420/466; 420/901; 505/805
[58] Field of Search ............... 505/124, 804, 505/805; 420/416, 455, 456, 463, 466, 901

[56] References Cited

U.S. PATENT DOCUMENTS 4,264,358  4/1981  Johnson et al. .................. 505/804

*Primary Examiner*—George Wyszomierski
*Attorney, Agent, or Firm*—Eugen E. Pacher

[57] ABSTRACT

Material comprising an effective amount of a novel intermetallic bulk superconductor compound is disclosed. The compound has the composition $LnNi_2B_2C$, with Ln being Y or a rare earth (atomic number 57–71), preferably Tm, Er, Ho or Ln. A compound of composition $XPt_2B_2C$, with X=Y and/or La, is also a superconductor.

6 Claims, 3 Drawing Sheets

ARTICLE COMPRISING AN INTERMETALLIC SUPERCONDUCTOR MATERIAL

REFERENCE TO RELATED APPLICATIONS

This application is a continuation-in-part of application Ser. No. 08/165,143, filed Dec. 10, 1993 by R. J. Cava et al., which is a continuation-in-part of application Ser. No. 08/143,419, filed Oct. 26, 1993 by R. J. Cava, which is now U.S. Pat. No. 5,413,755.

FIELD OF THE INVENTION

This application pertains to superconducting compositions, more specifically, to intermetallic superconducting compositions.

BACKGROUND OF THE INVENTION

Before the recent discovery of copper-oxide based superconductors, the materials with the highest superconducting critical temperatures ($T_c$) were Niobium- and Vanadium-based intermetallic compounds with the "A15" structure type. These are based on stoichiometry $A_3B$, with the earliest examples $V_3Si$ ($T_c=17K$) and $Nb_3Sn$ ($T_c=18K$) discovered in 1953. $T_c$'s in the vicinity of 20K are obtained for Nb-based materials only, with the record high $T_c$ of 23K for $Nb_3Ge$ obtainable in sputtered thin films only, not in bulk material. The highest known bulk $T_c$ is 20.7K for $Nb_3Ga$. The existence of these and many other Nb-based superconductors with lower $T_c$'s have led to the general belief that intermetallic superconductors should include Nb in the chemical system for the best results.

The superconducting magnets currently in wide use in machines such as MRI scanners employ Nb based alloy wire, but preparation of bulk materials with very high $T_c$'s in the A15 structure type has proven difficult. In view of this difficulty, alternative intermetallic superconducting materials with high $T_c$'s would be of considerable interest. Although the $T_c$'s of such intermetallic superconductors might be expected to be lower than those of the copper oxide based ceramic superconductors, the better processability and manufacturability of metals, along with the likelihood of good superconducting critical currents suggests possible advantages over ceramic materials for use at low temperatures.

Although the $T_c$'s of prior art boride superconductors are low, less than 12K, it has been widely speculated that the low mass of boron might result in the presence of high frequency lattice vibrations, and consequently the possibility for relatively high $T_c$'s. Recently, indications of superconductivity were discovered in a Y—Ni-boride composition. See C. Mazumdar et al., Solid State Communications, Vol. 87(5), pp. 413–416. A newly discovered Y—Ni-boride, an intermetallic composition, was formed by melting Y, Ni and B in nominal 1:4:1 atomic ratio in an arc furnace, and had $T_c$ (onset) of about 12K. However, superconductivity was not present at high levels in the samples.

In view of the great significance of intermetallic superconducting compositions, a new such composition would be of great interest, both scientifically and technologically. This application discloses such compositions.

Glossary and Definitions

An "intermetallic" composition is a composition of matter consisting essentially only of (two or more) metallic elements. Boron (B) and carbon (C) are herein considered to be metallic elements.

Associated with a sample of superconductor material typically are several "transition temperatures" $T_c$. Among them are $T_c$ (onset) and $T_c$ (R=0). The former is the highest temperature at which an indication of superconductivity is observable, and the latter is the highest temperature at which the DC electrical resistance of the sample is essentially zero, to within experimental accuracy. $T_c$ (onset) applies to all appropriate experimental techniques, e.g., resistivity measurements or magnetic measurements.

THE INVENTION

I have discovered a new intermetallic superconductor having a surprisingly high transition temperature, exemplarily 22.6K in a bulk sample, higher than that of bulk $Nb_3Ge$, indeed, higher than that of any other bulk intermetallic composition.

The invention is embodied in an article that comprises a quantity of material that exhibits superconductivity. The material is an intermetallic material that comprises Y, Pd and B, with the chemical composition of the material selected such that the material has a critical temperature $T_c$ (onset) of 20K or higher.

Exemplary of the new superconductor is material of overall composition $Y_{1.5}Pd_{4.5}B_4$, which was found to have $T_c$ (onset) of 22.6K. The magnitude of the diamagnetic response of a sample was indicative of the presence of about 0.5 volume % of superconducting material in a non-superconducting matrix.

Figure 1:
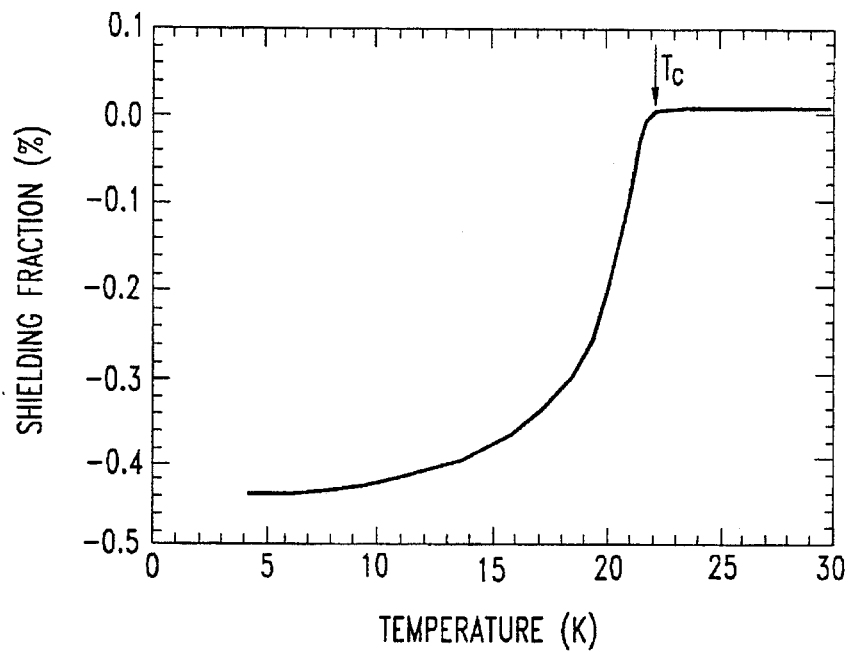
FIGS. 1 and 3–6 show magnetic susceptibility data of exemplary compositions according to the invention.

Exemplarily, the new superconducting composition was prepared by mixing elemental Y, Pd and B (purity at least 99.9%) in the desired atomic ratio, e.g., 1.5:4.5:4. The starting materials were in the form of coarse powders, small chunks or metal shavings. The mixture, exemplarily 1 gram weight, was pressed into a small pellet by conventional means. The pellet was arc melted in a commercially apparatus (Centorr Furnaces, Nashua, N.H.) under an Ar atmosphere. After solidification and cooling, the resulting button was turned over and melted again under substantially the same conditions. This melting process was repeated once, but can be repeated more often to ensure sample homogeneity. After completion of the process of making the intermetallic sample, a portion of the sample was tested by conventional means (ac susceptibility, Lakeshore Model 7000 Susceptometer). FIG. 1 shows exemplary results, obtained on 0.3188 g of material of nominal composition $Y_{1.5}Pd_{4.5}B_4$, prepared as described above. The data shows that the exemplary material has $T_c$ (onset) of 22.6K, with about half of one percent of the total material being superconducting.

Figure 2:
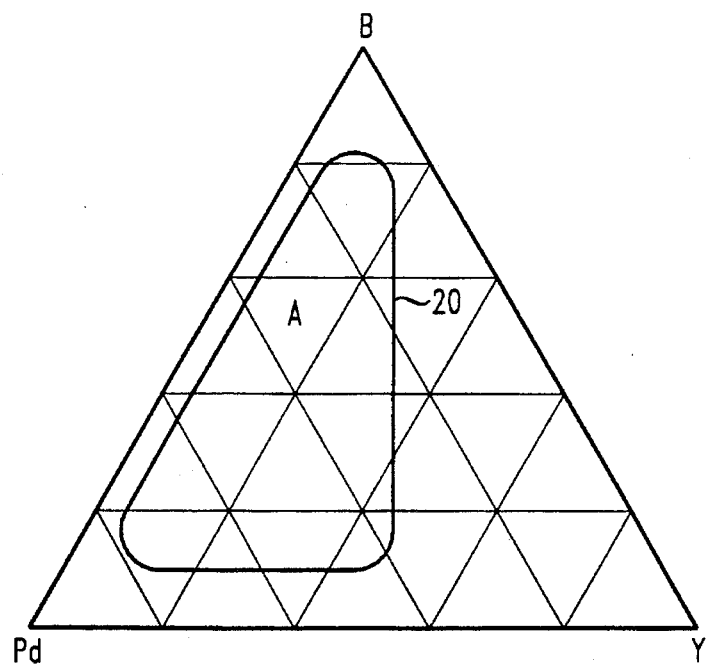
FIG. 2 indicates currently preferred compositions in the Y—Pd—B compositional space.

The disclosed Y:Pd:B atomic ratio (1.5:4.5:4) is exemplary only. FIG. 2 shows the compositional space of the Y—Pd—B system in conventional form. The region of the compositional phase that, according to my present understanding, contains the preferred compositions according to the invention is region A, enclosed by line 20.

We have now discovered that addition of C to the Y—Pd—B can have beneficial effects, including a substantial increase in the fraction of the sample that is superconducting, and possibly a modest increase in $T_c$ (onset). Indeed, based on our investigation of are melted samples of material in the Y—Pd—B—C quaternary system, we currently believe that the presence of carbon is necessary for the occurrence of bulk superconductivity in that system.

Exemplarily, samples were prepared by arc-melting. Starting materials were commercially available Y shavings (99.9% purity), Pd powder (>99.99% purity), and coarse C (99.99% purity) and B powder (99.6% purity, largest impurity 0.17% C). Samples of about 0.6 to 0.75 gm total weight were first pressed into 0.25-inch diameter pellets. The pellets were then arc-melted under Ar on a standard water cooled copper hearth. Melting was repeated up to two or more times, with the button turned over between meltings. Exemplarily, superconductivity was observed for thus prepared samples having a relatively low carbon content. Those skilled in the art will understand that the composition of the phase (or phases) responsible for the observed superconductivity may depart from the nominal composition of the superconducting sample.

Exemplarily, samples of nominal composition $YPd_5B_3C_x$ ($0.3 \leq x \leq 0.4$) exhibited large magnetic shielding fractions, up to approximately 80%, and large magnetic flux exclusion fractions (Meissner effect) 10–15% of that expected for an ideal diamagnet. As those skilled in the art know, the Meissner effect fraction represents a lower limit to the actual fraction of superconducting phase present in the sample, due to flux pinning effects.

Figure 3:
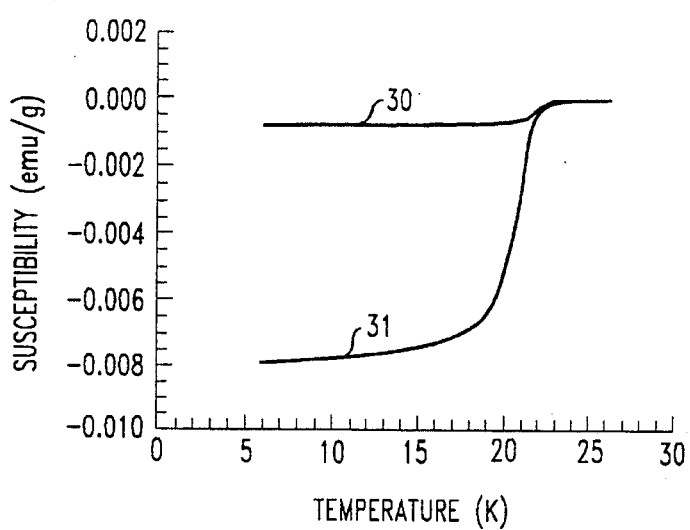

FIG. 3 shows exemplary magnetization data vs. temperature, for a sample of composition $YPd_5B_3C_{0.35}$, prepared as described above. Reference numeral 30 refers to the shielding curve, and 31 refers to the Meissner effect curve. The former attained a value of about 75% (of the signal expected from a corresponding ideal aliamagnet) at 5K, and the latter attained a value of about 10% (also of the signal expected from the ideal aliamagnet) at that temperature. The measurements were made with a commercially available (Quantum Design) SQUD magnetometer in conventional manner, with an applied field of 20 Oe. The results indicate $T_c$ (onset) of about 22.5K. Similar results are obtained for other samples having Y, Pd and B content in region A of HG. 2. Exemplarily, the carbon content is in the range 5–200% of the (atomic) B content. More generally, the composition of Y—Pd—B—C compositions according to the invention is $Y_yPd_zB_xC_x$ with $0.5 \leq y \leq 1.5$, $2 \leq z \leq 6$, $1 \leq x' \leq 4$, and x:x' in the range 0.05–2.

We have also measured the DC resistivity of various samples. For instance, a sample of nominal composition $YPd_5B_3C_{0.35}$ had room temperature resistivity of about 200 $\mu\Omega \cdot cm$, with relatively little resistivity decrease during cooling until the onset temperature is reached. $T_c$ (onset) was about 23K, the 10–90% transition width was 0.3K.

Heat treatment after solidification of the melt may affect the superconducting properties of the resulting material. For instance, annealing a (Ta foil wrapped) superconducting sample for two days at 900° C. in a sealed evacuated quartz tube resulted in complete loss of superconductivity.

Samples were also prepared by melting a sample of the (previously prepared) ternary (omitting C) or quaternary (including C) alloy on a carbon block (volume about 2 cc) laid on the copper hearth. This set-up resulted in slower cooling of the sample, since the heated carbon block cooled relatively slowly. However, this preparatory technique did not allow for close control of the carbon content of the resulting material, since carbon from the block was likely to become incorporated into the sample.

Figure 4:
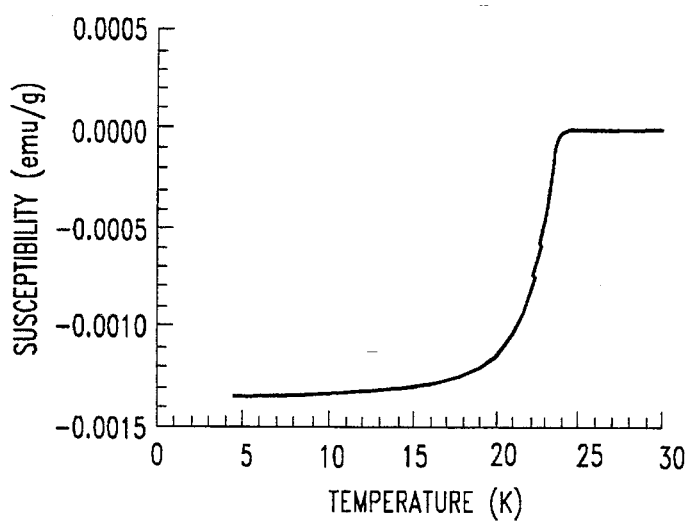

FIG. 4 shows magnetic shielding data for a sample produced by melting pre-melted ternary material of nominal composition $Y_{1.25}Pd_{4.5}B_{4.25}$ on a carbon block as described above. The sample had $T_c$ (onset) of about 23K, the highest temperature at which any bulk intermetallic sample has exhibited superconductivity to date.

Figure 5:
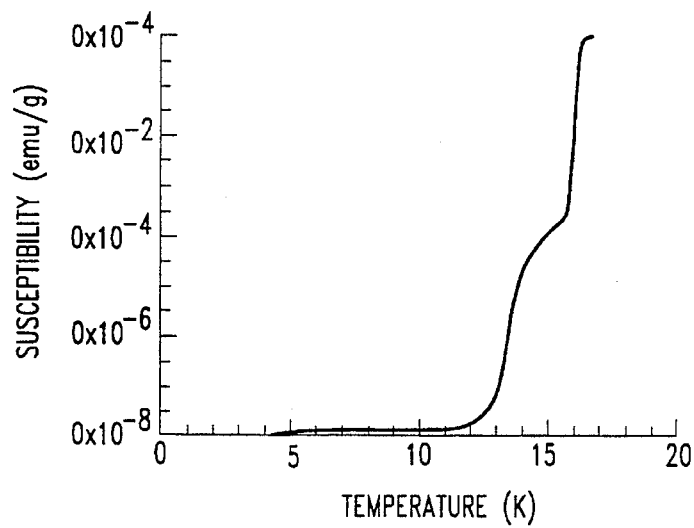

Although the currently preferred compositions belong to the Y—Pd—B—C system, the invention is not so limited. For instance, we have discovered that some materials of nominal composition $Lu_yNi_zC_xC_x$, or $Y_yNi_zB_xC_x$ ($0.5 \leq y \leq 1.5$; $2 \leq z \leq 6$; $1 \leq x' \leq 4$; and x:x' in the range 0.05–2), synthesized as described above, were bulk superconductors, with $T_c$ (onset) in the range 14–17K. Lu—Ni—B—C and Y—Ni—B—C samples remained superconducting after an anneal at 900° C. in vacuum. FIG. 5 shows magnetic susceptibility (Meissner effect) data for an exemplary sample of nominal composition $LuNi_4B_3C$ and weight 0.13 g. The hump at about 15K is believed to be due to flux trapping.

Our results to date indicate that material that contains, in addition to B and C, one or more elements M selected from the group consisting of Y, the lanthanides (atomic number 57-71) and the alkaline earths, and further contains one or more transition metals M' can exhibit superconducting properties. The material thus has general formula $M_yM'_zB_xC_x$, with $0.5 \leq y \leq 1.5$, $2 \leq z \leq 6$, $1 \leq x' \leq 4$, and x:x' in the range 0.05–2.

We have also discovered that quaternary intermetallic compounds of nominal composition $LnNi_2B_2C$ [Ln is Y and/or a rare earth (e.g., Tm, Er, Ho and/or Lu) that is compatible with superconductivity in the compound] can be substantially single phase superconductor material. The superconducting phase has, at least in $LuNi_2B_2C$ and $YNi_2B_2C$, tetragonal symmetry, with unit cell of dimensions a~0.346 nm, c~1.063 nm, and a~0.353 nm, c~1.057 nm, respectively. The "rare earths" are the elements of atomic number 57–71.

Very well formed single crystals of composition $LuNi_2B_2C$ were obtained directly from a melt of nominal composition $LuNi_4B_3C$. The crystals were mixed in the solidified melt with finely crystallized $Ni_2B$ and small quantities of a third phase. Melts of nominal composition $LuNi_2B_2C$ did not solidify as a single phase, implying that the new superconductor is not a congruent melter. However, appropriate annealing (e.g., in an evacuated quartz tube, 1 or 2 nights at 1050°–1100° C.) can result in essentially single phase ($\leq 10\%$ by volume of other phases, even less than 2% b.v. other phases) superconductor material.

The new phase formed for Ln=Y, Tm, Er, Ho, Lu, Tb, Sin, Ce and La. Compounds with other rare earths were not yet investigated, but may also form the new phase. Superconductivity was observed for both non-magnetic Ln (Y and Lu) and magnetic Ln (Tm, Er, Ho). The compound did not exhibit superconductivity above 4.2K for Ln other than Y, Lu, Tm, Er and Ho. However, it cannot be ruled out that other preparative approaches may result in superconductive $LnNi_2B_2C$ for one or more of the other rare earths.

Figure 6:
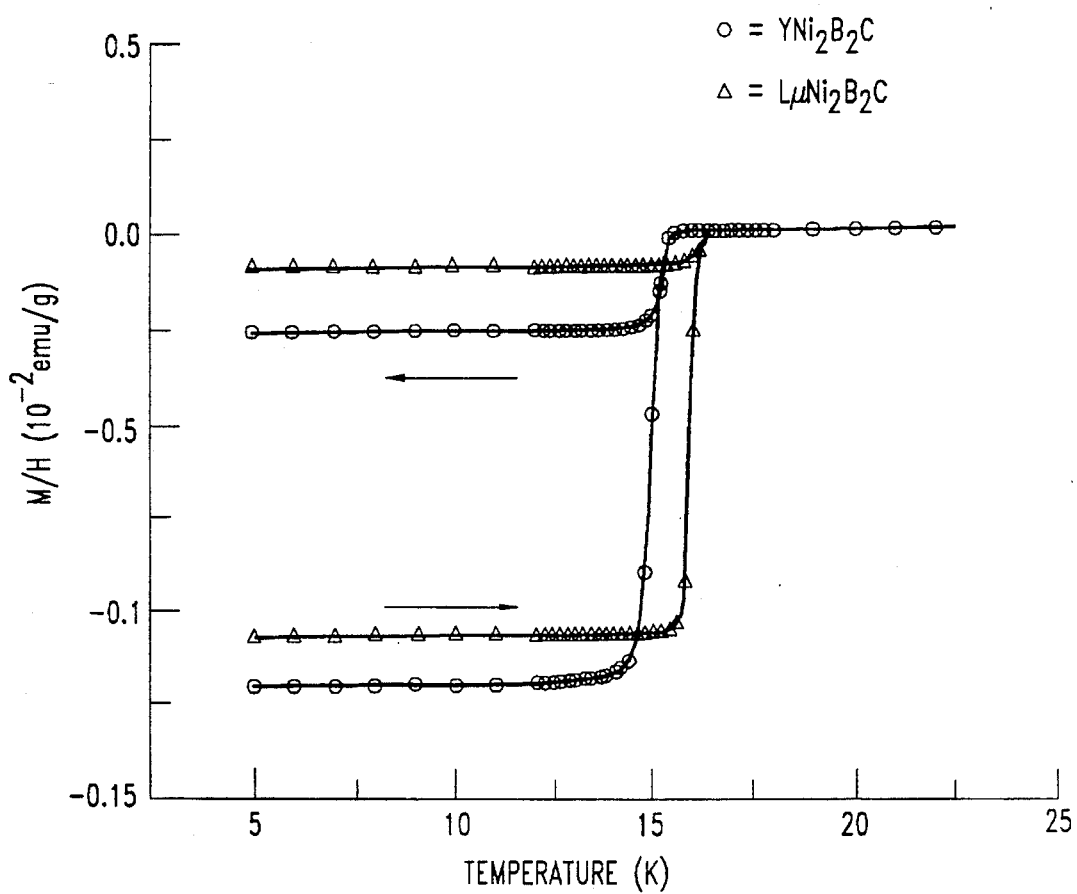

FIG. 6 shows exemplary data of magnetization as a function of temperature for essentially single phase polycrystalline samples of $LnNi_2B_2C$ and $YNi_2B_2C$. The magnetization was measured with a conventional SQUID magnetometer in a field of 20 Oe. The arrows indicate the direction of temperature change. On cooling in the field, the flux expulsion values (Meissner effect) correspond to approximately 10% of that expected for perfect diamagnetism, showing that the superconductivity is a bulk effect. The magnetization was also measured upon cooling in zero field. The results showed magnetic shielding equal to approximately 100% of the value expected for perfect diamagnetism.

The existence of hysteresis between zero field cooling and field cooling indicates that the new materials are type II superconductors. The sharpness of the superconducting transitions ($T_c$=16.6K for $LuNi_2B_2C$, and 15.6K for $YNi_2B_2C$; the 10–90% transition widths are typically approximately 0.5K) indicate a high degree of material uniformity.

Shielding and Meissner effect measurements for $LnNi_2B_2C$, with Ln a magnetic rare earth such as Tm, showed results similar to those of FIG. 6. However, these "magnetic rare earth" compounds had substantially lower $T_c$ values, 8.0, 10.5 and 11.0K for Ln=Ho, Er and Tm, respectively. This suggests that the magnetic f-electrons are pair breaking.

Samples of the novel intermetallic compounds were prepared substantially as described above. Exemplarily, Ln metal shavings or sublimed dentrites (3N or 4N purity), Ni powder (4N), and coarse C (4N) and B (99.6%) powder were mixed in stoichiometric (i.e., 1:2:2:1 molar) ratio. Samples of 0.75 g weight were pressed into 0.25 inch diameter pellets by conventional means. A given pellet was then arc melted under Ar on a standard water cooled copper hearth. Melting was repeated twice, with the pellet being turned over between melts. A thus prepared sample was wrapped in Ta foil, sealed in an evacuated quartz tube, and annealed for an extended period (e.g., 16–48 hours) at a temperature in the range 1050°–1100° C. This procedure typically resulted in essentially single phase polycrystalline superconducting material (for Ln=Y, Tm, Er, Ho and Lu).

We anticipate that not only essentially single phase but also modestly multiphase Ln—Ni—B—C material will be of commercial interest. Thus, departure of up to ±25 atomic % (preferably not to exceed ±10 atomic %) from the formula amount of any constituent element is contemplated. In other words, material according to the invention can be superconducting material of overall composition $Ln_aNi_bB_cC_d$, where $0.75 \leq a \leq 1.25$, $1.50 \leq b \leq 2.50$, $1.50 \leq c \leq 2.50$, and $0.75 \leq d \leq 1.25$, preferably $0.90 \leq a \leq 1.10$, $1.80 \leq b \leq 2.20$, $1.80 \leq c \leq 2.20$, and $0.90 \leq d \leq 1.10$.

We have also discovered that intermetallic compounds of composition $LaPt_2B_2C$ and $YPt_2B_2C$ have a superconducting transition temperature of 11K and 9K, respectively. These compounds can be prepared essentially as described above.

Material according to the invention is expected to be useful for substantially all currently contemplated applications for bulk superconductor material, e.g., magnetic shields and current conductors.

We claim:

1. An article comprising a quantity of material that exhibits superconductivity,

CHARACTERIZED IN THAT the material is an intermetallic compound of composition $LnNi_2B_2C$, where Ln is selected from the group consisting of Y and the rare earths (atomic number 57–71).

2. An article according to claim 1, wherein Ln is selected from the group consisting of Y, Tm, Er, Ho and Lu.

3. An article comprising a quantity of material that exhibits superconductivity, CHARACTERIZED In THAT the material is a material of over-all composition $Ln_aNi_bB_cC_d$, where Ln is selected from the group consisting of Y and the rare earths (atomic number 57–71), and where $0.75 \leq a \leq 1.25$, $1.50 \leq b \leq 2.50$, $1.50 \leq c \leq 2.50$, and $0.75 \leq d \leq 1.25$.

4. Article according to claim 3, wherein Ln is selected from the group consisting of Y, Tm, Er, Ho and Lu, and wherein $0.90 \leq a \leq 1.10$, $1.80 \leq b \leq 2.20$, $1.80 \leq c \leq 2.20$, and $0.90 \leq d \leq 1.10$.

5. Article according to claim 4, wherein a, b, c and d are essentially equal to 1, 2, 2 and 1, respectively.

6. An article comprising a quantity of material that exhibits superconductivity,

CHARACTERIZED IN THAT the material is an intermetallic compound of composition $XPt_2B_2C$, where X is selected from the group consisting of Y and La.

* * * * *